(12) United States Patent
Yang

(10) Patent No.: US 10,354,743 B2
(45) Date of Patent: Jul. 16, 2019

(54) MEMORY SYSTEM INCLUDING PLURALITY OF MEMORY REGIONS AND METHOD OF OPERATING THE SAME

(71) Applicant: SK hynix Inc., Gyeonggi-do (KR)

(72) Inventor: Chan Woo Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 79 days.

(21) Appl. No.: 15/063,065

(22) Filed: Mar. 7, 2016

(65) Prior Publication Data

US 2016/0365158 A1 Dec. 15, 2016

(30) Foreign Application Priority Data

Jun. 12, 2015 (KR) .................. 10-2015-0083442

(51) Int. Cl.
| | | |
|---|---|---|
| *G11C 29/00* | (2006.01) | |
| *G11C 29/42* | (2006.01) | |
| *G06F 11/10* | (2006.01) | |
| *G11C 29/52* | (2006.01) | |
| *G11C 29/04* | (2006.01) | |

(52) U.S. Cl.
CPC .......... *G11C 29/42* (2013.01); *G06F 11/1068* (2013.01); *G11C 29/52* (2013.01); *G11C 2029/0411* (2013.01)

(58) Field of Classification Search
CPC ......... A61B 5/00; A61K 31/496; G06F 11/10; G06F 11/1068; G06F 12/00; G06F 12/02; G06F 12/06; G06F 17/30; G06F 3/06; G11C 11/00; G11C 16/349; G11C 16/3495; G11C 2029/0411; G11C 29/42; G11C 29/52; H03M 13/05; H03M 13/1102; H03M 13/1515
USPC ........................................................ 714/719
See application file for complete search history.

(56) References Cited

U.S. PATENT DOCUMENTS

| | | | | |
|---|---|---|---|---|
| 6,058,047 A | * | 5/2000 | Kikuchi ............. | G06F 11/1068 365/185.33 |
| 6,684,353 B1 | * | 1/2004 | Parker ................. | G11C 29/44 714/718 |
| 8,467,249 B2 | * | 6/2013 | Katz .................... | G11C 16/26 365/185.02 |

(Continued)

FOREIGN PATENT DOCUMENTS

| | | |
|---|---|---|
| KR | 1020100102925 | 9/2010 |
| KR | 1020130013574 | 2/2013 |

*Primary Examiner* — Albert Decady
*Assistant Examiner* — Enamul M Kabir
(74) *Attorney, Agent, or Firm* — IP & T Group LLP

(57) ABSTRACT

A method of a memory system including memory regions includes performing error corrections for chunks in each of the memory regions, and computing trust levels corresponding respectively to the memory regions based on the error corrections, setting test-reading periods corresponding respectively to the memory regions, based on the trust levels for the memory regions, counting a number of normal-reading times for each of the memory regions, and managing access counts corresponding respectively to the memory regions based on the counted numbers and when an access count for a first memory region among the memory regions reaches a time corresponding to a test-reading period for the first memory region, performing one or more test-readings for the first memory region.

11 Claims, 11 Drawing Sheets

(56) References Cited

U.S. PATENT DOCUMENTS

| | | | |
|---|---|---|---|
| 2008/0052015 A1* | 2/2008 | Ozawa | G01R 31/31932 702/57 |
| 2009/0055680 A1* | 2/2009 | Honda | G06F 11/1068 714/5.1 |
| 2009/0193301 A1* | 7/2009 | Ito | G11C 11/406 714/704 |
| 2010/0058119 A1* | 3/2010 | Reid | G06F 11/1068 714/49 |
| 2010/0070686 A1* | 3/2010 | Mergler | G06F 11/1068 711/103 |
| 2010/0235713 A1* | 9/2010 | Lee | G06F 11/1072 714/763 |
| 2010/0251075 A1* | 9/2010 | Takahashi | G06F 11/1068 714/773 |
| 2010/0306577 A1* | 12/2010 | Dreifus | G11C 29/76 714/6.12 |
| 2010/0306580 A1* | 12/2010 | McKean | G06F 12/0246 714/6.13 |
| 2012/0079351 A1* | 3/2012 | Cideciyan | G06F 11/1048 714/764 |
| 2012/0246525 A1* | 9/2012 | Shibata | G11C 16/3431 714/704 |
| 2013/0128666 A1* | 5/2013 | Avila | G06F 11/1048 365/185.11 |
| 2013/0212324 A1* | 8/2013 | Hashimoto | G06F 3/0616 711/103 |
| 2013/0238836 A1* | 9/2013 | Suzuki | G11C 16/3431 711/103 |
| 2014/0136883 A1* | 5/2014 | Cohen | G06F 11/2094 714/6.11 |
| 2014/0173239 A1* | 6/2014 | Schushan | G11C 16/3427 711/165 |
| 2014/0173268 A1* | 6/2014 | Hashimoto | G06F 11/0754 713/2 |
| 2015/0074476 A1* | 3/2015 | Kim | G11C 29/44 714/723 |
| 2015/0199231 A1* | 7/2015 | Tressler | G06F 11/1068 714/764 |
| 2015/0228336 A1* | 8/2015 | Kim | G11C 13/0035 365/163 |
| 2015/0378800 A1* | 12/2015 | Suzuki | G06F 12/16 714/49 |
| 2016/0110124 A1* | 4/2016 | Camp | G06F 3/0619 714/704 |
| 2016/0124679 A1* | 5/2016 | Huang | G06F 3/0647 711/103 |
| 2016/0179664 A1* | 6/2016 | Camp | G06F 11/108 711/103 |

* cited by examiner

FIG. 9

TBL1

| MEMORY REGION | TEST-READING PERIOD |
|---|---|
| 110_1 | VL1 |
| 110_2 | VL2 |
| 110_3 | VL3 |
| ⋮ | |
| 110_n | VLn |

FIG. 10

TBL2

| MEMORY REGION | ACCESS COUNT |
|---|---|
| 110_1 | ACCNT1 |
| 110_2 | ACCNT2 |
| 110_3 | ACCNT3 |
| ⋮ | |
| 110_n | ACCNTn |

FIG. 11
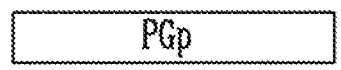
 REPRESENTATIVE PAGE
FIG. 12
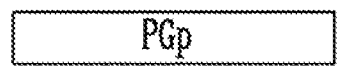
 REPRESENTATIVE PAGE

MEMORY SYSTEM INCLUDING PLURALITY OF MEMORY REGIONS AND METHOD OF OPERATING THE SAME

CROSS-REFERENCE TO RELATED APPLICATION

The present application claims a priority to a Korean patent application number 10-2015-0083442 filed on Jun. 12, 2015, the entire disclosure of which is incorporated herein in its entirety by reference.

BACKGROUND

Technical Field

The embodiments of present disclosure generally relate to an electronic device, and more particularly, to a memory system including a plurality of memory regions and a method of operating the same.

Discussion of Related Arts

Semiconductor memory devices may be implemented using semiconductor materials such as silicon (SI), germanium (Ge), gallium arsenide (GaAs), indium phosphide (InP) or the like. The semiconductor memory devices may be classified into volatile and nonvolatile memory devices.

Volatile memory devices may lose data stored therein, while powered off. The volatile memory devices may include SRAM (Static RAM (Random Access Memory)), DRAM (Dynamic RAM), SDRAM (Synchronous DRAM) and the like. Nonvolatile memory devices may maintain data stored therein, even while powered off. The nonvolatile memory devices may include ROM (Read Only Memory), PROM (Programmable ROM), EPROM (Erasable Programmable ROM), EEPROM (Electrically Erasable Programmable ROM), flash memory, PRAM (Phase-change RAM), MRAM (Magnetoresistive RAM), RRAM (Resistive RAM), FRAM (Ferroelectric RAM) and the like. Flash memory devices may be classified into NOR and NAND architectures.

SUMMARY

The embodiments of present disclosure provides a memory system with an enhanced operation rate and a method of operating the same.

In one aspect of the present disclosure, there is provided a method of operating a memory system including memory regions, the method comprising (a) performing error corrections for chunks in each of the memory regions, and computing trust levels corresponding respectively to the memory regions based on the error corrections, (b) setting test-reading periods corresponding respectively to the memory regions, based on the trust levels for the memory regions, (c) counting a number of normal-reading times for each of the memory regions, and managing access counts corresponding respectively to the memory regions based on the counted numbers, and (d) a access count for a first memory region among the memory regions reaches a time corresponding to a test-reading period for the first memory region, performing one or more test-readings for the first memory region.

As an embodiment, the performing of the one or more test-readings for the first memory region may include reading chunks in the first memory region, and performing error corrections for the read chunks in the first memory regions, wherein when one or more of the read chunks are determined to have a number of error bits larger than or equal to a threshold value, the first memory region may be read-reclaimed.

As an embodiment, when the first memory region is red-reclaimed, data stored in the first memory region may be copied into a second memory region among the memory regions.

As an embodiment, wherein the (a) may comprise obtaining error values corresponding respectively to the chunks in each memory region by performing the error corrections for the chunks, and defining a maximum error value among the error values as a trust level for the memory region.

As an embodiment, when the maximum error value for the memory region is larger than a reference value, a test-reading period for the memory region may have a first value. When the maximum error value for the memory region is smaller than or equal to the reference value, the test-reading period for the memory region may have a second value larger than the first value.

As an embodiment, the test-reading period for the memory region may be inverse-proportional to a magnitude of the maximum error value for the memory region.

As an embodiment, each of the memory regions may include a plurality of pages, and the chunks subjected to the error corrections in the (a) may be contained in a single representative page among the plurality of pages in each memory region. The normal-readings for each memory region may be performed on the plurality of pages therein. The one or more test-readings for the first memory region may be performed on a single representative page therein.

As an embodiment, each of the memory regions may include a plurality of pages, and the chunks subjected to the error corrections in the (a) may be contained in two or more representative pages among the plurality of pages in each memory region. Normal-readings for each memory region may be performed on the plurality of pages therein. The one or more test-readings for the first memory region may be performed on two or more representative pages therein.

In another aspect of the present disclosure, there is provided a method of operating a memory system including memory regions, the method comprising (A) performing first normal-readings for a selected memory region among the memory regions, in response to first requests from an external, (B) when a number of times of the first normal-readings is larger than a pre-determined value, performing error corrections for chunks in the selected memory region, and computing a trust level corresponding to the selected memory region based on the error corrections, (C) setting a test-reading period corresponding to the selected memory region, based on the trust level for the selected memory region, (D) performing second normal-readings for the selected memory region in response to second requests from the external, (E) counting a number of times of the second normal-readings for the selected memory region, and managing a access count corresponding to the selected memory region based on the counted number, and (F) when the access count for the selected memory region reaches a time corresponding to the test-reading period for the selected memory region, performing one or more test-readings for the selected memory region.

As an aspect of the present disclosure, there is provided a memory system comprising a semiconductor memory device including memory regions, each memory region including a plurality of memory cells, and a controller configured to access the semiconductor memory device. The controller comprises a memory control module configured to compute trust levels corresponding respectively to the memory regions based on error corrections for chunks in each of the memory regions, a test-reading control module configured to set test-reading periods corresponding respectively to the memory regions, based on the trust levels for the memory regions, a random access memory (RAM) configured to store the test-reading periods, and an access counter configured to count a number of normal-reading times for each of the memory regions, and manage access counts corresponding respectively to the memory regions based on the counted numbers. The test-reading control module may detect a memory region of which an access count reaches a time corresponding to a test-reading period thereof, among the memory regions. The memory control module may perform one or more test-readings for the detected memory region, and determine, based on a result of the test-readings, whether to reclaim a reading for the detected memory region.

According to an embodiment of the present disclosure, the memory system could have an enhanced operation rate.

BRIEF DESCRIPTION OF THE DRAWINGS

FIG. 9 illustrates an example of a first table containing test-reading period values.

FIG. 10 illustrates an example of a second table TBL2 containing access count values.

FIG. 11 is a simplified schematic illustrating an example of a representative page in each memory region of a memory device, according to an embodiment of the present disclosure.

FIG. 12 is a simplified schematic illustrating an example of two or more representative pages in each memory region of a memory device, according to an embodiment of the present disclosure.

DETAILED DESCRIPTIONS

Figure 1:
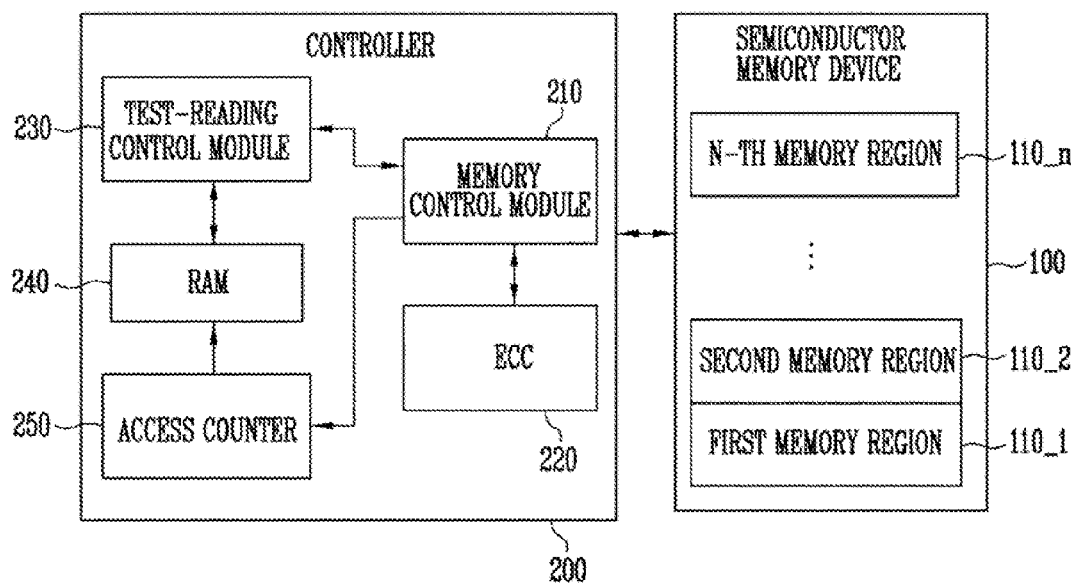
FIG. 1 is a block diagram illustrating a memory system, according to an embodiment of the present disclosure.

Examples of various embodiments are illustrated in the accompanying drawings and described further below. It is noted, however, that the present disclosure may be embodied in various different forms, and should not be construed as being limited to only the embodiments illustrated herein. Rather, the illustrated embodiments are provided as examples so that the disclosure is thorough and complete, and fully conveys the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Moreover, the terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "Including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, if the device in the figures is turned over, elements described as "below", "beneath", or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in detail with reference to the attached drawings.

Referring to FIG. 1, a memory system 1000 is provided, according to an embodiment of the invention. The memory system 1000 may include a semiconductor memory device 100 and a controller 200. The semiconductor memory device 100 may operate under the control of the controller 200. The semiconductor memory device 100 may include a plurality of memory regions 110. Each of the plurality of memory regions 110 may include a plurality of pages.

Under the control of the controller 200, the semiconductor memory device 100 may program one or more of the plurality of memory regions 110 with data, output data read from one or more of the plurality of memory regions 110 to the controller 200, and/or erase data stored in one or more of the plurality of memory regions 110.

The controller 200 may be configured to control all operations of the semiconductor memory device 100. The controller 200 may be configured to access the semiconductor memory device 100 in response to a request from an external host (not shown).

The controller 200 may include a memory control module 210, an error correction code block 220, a test-reading control module 230, a RAM 240, and an access counter 250.

The memory control module 210 may be configured to control reading, writing, erasing, and background operations of the semiconductor memory device 100. The memory control module 210 may be configured to drive firmware for controlling the semiconductor memory device 100.

Upon receipt of a reading request from the host, the memory control module 210 may provide the semiconductor memory device 100 with a command for reading data (hereinafter also referred to as a reading command) form a selected page corresponding to the reading request. The memory control module 210 may translate a logical block address contained in the reading request to a physical block address. In an embodiment, the memory control module 210 may perform a function of a flash translation layer (FTL). The memory control module 210 may provide the semiconductor memory device 100 with the physical block address together with the reading command. Upon receipt of the reading command, the semiconductor memory device 100 may read data from a selected page in a selected memory region and then send the read data to the controller 200.

The error correction code block 220 may be configured to correct an error contained in the read data. The error correction code block 220 may carry out the error correction on a predetermined data-bit basis. For example, a single page may include four data chunks, and each error correction may be carried out on a single data chunk basis. Thus, for example, when data of an entire single page are read, error correction may be carried out four times.

The error correction code block 220 may decode the read data according to an error correction code. It should be understood that any suitable error correction code may be employed, including, the well-known BCH (Bose, Chaudhuri, Hocquenghem), Reed-Solomon, Hamming, LDPC (low-density parity-check) codes, or the like.

When the number of error bits contained in data bits of a single chunk exceeds the number of correctable bits, the error correction code block 220 may not correct an error of the chunk and error correction may fail. Otherwise, when the number of error bits contained in data bits of a single chunk is smaller than or equal to the number of correctable bits, the error correction may succeed.

According to an embodiment of the present disclosure, in order to set a test-reading period, the memory control module 210 may read a page in a memory region without a reading request from an external host. For example, the memory control module 210 may instruct the error correction code block 220 to correct an error in the read data. The memory control module 210 may be configured to compute first to n-th trust levels corresponding respectively to the first to n-th memory regions 110_1 to 110_n based on the error correction.

The test-reading control module 230 may operate under control of the memory control module 210. The test-reading control module 230 may be configured to set first to n-th test-reading periods based on the computed first to n-th trust levels. The first to n-th test-reading periods may correspond respectively to the first to n-th memory regions 110_1 to 110_n. The first to n-th test-reading periods may be independent of one another.

The test-reading control module 230 may store the first to n-th test-reading periods into the RAM 240.

After the first to n-th test-reading periods have been set, the access counter 250 may count the number of normal-reading times for each of the memory regions 110. For example, the access counter 250 may monitor a physical block address sent to the semiconductor memory device 100 from the memory control module 210, and may count the number of normal-reading times based on the physical block address. In this way, first to n-th access counts may be created and stored in the RAM 240. The first to n-th access counts may correspond to the number of normal-reading times for the first to n-th memory regions 110_1 to 110_n, respectively. An increase in the access count may reflect an increase in the number of normal-reading times for each memory region.

For a normal reading operation, a selected memory region may be biased with a high voltage. For example, for a normal reading, word lines and bit lines connected to pages of the memory region may be biased with specific voltages. For example, word lines connected to unselected pages may be biased with a high voltage. Memory cells in the memory region may have respective threshold voltages corresponding to data stored therein. As a memory region may be read typically many times repetitively, the threshold voltages for the memory cells may change. Also, when a high voltage is applied to unselected pages via word lines connected thereto, memory cells therein may be subjected to changes in their threshold voltages. Memory cells having changed threshold voltages may have a lowered data retention quality.

The test-reading control module 230 may detect at least one memory region 110_1 to 110_n for which the access count corresponds to a time equal to a test-reading period thereof. The memory control module 210 may then perform at least one test-reading for the detected memory region or regions. During a test reading, data may be read from the detected memory region or regions. For example, the memory control module 210 may read data from at least one page from the detected memory region or regions and may then instruct the error correction code block 220 to correct an error in the read data. When the number of error bits in the read data exceeds a threshold value, the memory control module 210 may reclaim a reading operation for the detected memory region or regions and copy data stored in the detected memory region to another memory region.

In an embodiment, a single test-reading period may be applied to all memory regions 110 of a semiconductor memory device 100. Various factors including manufacturing and/or operating characteristics of a semiconductor device 100 may be taken into consideration in determining a test-reading period. A single semiconductor memory device 100 may have a single test-reading period applied to all of its memory regions 110 which may be determined based on a memory region 110 having a low or the lowest trust level from among the plurality of the memory regions 110. In other words, a single test-reading period may be applied to all of the memory regions 110 of a semiconductor memory device 100, however, in such a case, although some of the memory regions 110 may have a relatively good data retention level, a significantly short test-reading period may be applied to them. For example, although some of the memory regions 110 may retain reliable data even after normal-reading operations have been carried out x times, they may be test-read whenever normal-reading operations are carried out y times, wherein y may be smaller than x. This may lead to unnecessary test-read operations to be performed which may in turn lower the operation speed of the semiconductor memory device 100.

Hence, according to a preferred embodiment of the present disclosure, different, or individual test-reading periods may be applied to the memory regions 110 of the semiconductor memory device 100. For example, a memory region having a low data retention level may have a short test-reading period applied thereto, while a memory region with a high data retention level may have a long test-reading period applied thereto. In this way, the number of times of test-readings may be reduced. This may translate to an improved operation rate of the memory system 1000. In an embodiment, an individual test-reading period may be applied to each memory region 110 of a memory device specifically tailored for the data retention level of each memory region. In yet another embodiment, the memory regions may be divided into groups based on their relative data retention level. For example, memory regions may be grouped into low, medium and high data retention level, in which case three different test-read periods, short, medium and long, respectively, may be applied thereto.

Figure 2:
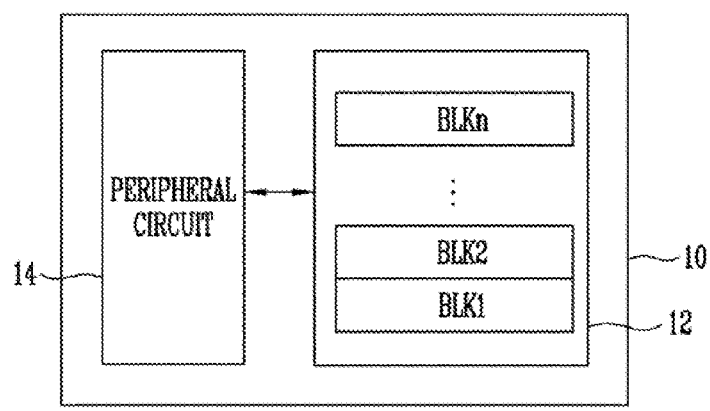
FIG. 2 is a block diagram illustrating a semiconductor memory device, according to an embodiment of the present disclosure.
Figure 3:
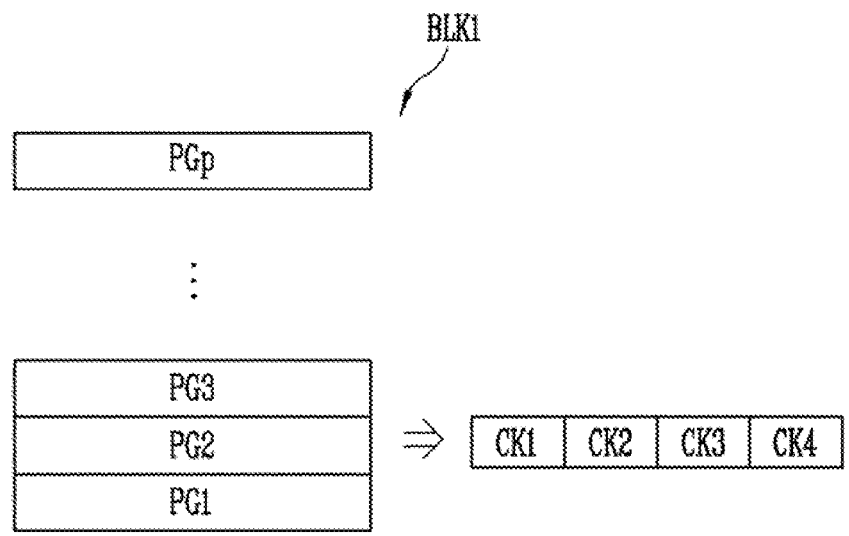
FIG. 3 is a block diagram illustrating, a memory block shown in FIG. 2.

FIG. 2 is a block diagram illustrating an embodiment 10 of a semiconductor memory device 100 shown in FIG. 1. FIG. 3 is a block diagram illustrating a single memory block BLK1 from among a plurality of memory blocks BLK1 to BLKn shown in FIG. 2.

Referring to FIG. 2, the semiconductor memory device 10 may include a memory cell array 12 and a peripheral circuit 14. The memory cell array 12 may include a plurality of memory blocks BLK1 to BLKn. Referring to FIG. 3, a single memory block BLK1 may include a plurality of pages PG1 to PGp. A single page may include memory cells (not shown) connected to a single word line. The semiconductor memory device 10 may be erased on a memory block basis. The semiconductor memory device 10 may be programmed or read on a page basis. Each page may include a plurality of chunks CK1 to CK4. The error correction code block 220 may perform an error correction on a chunk basis.

According to an embodiment of the present disclosure, the first to n-th memory blocks BLK1 to BLKn may be implemented as the first to n-th memory regions (110_1 to 110_n in FIG. 1).

As shown in FIG. 2, the peripheral circuit 14 may operate under control of the controller 200. For example, for a programming operation, the peripheral circuit 14 may receive from the controller 200 a programming command, a physical block address, and data to be programmed. Based on the physical block address, a single memory block and a single page therein may be selected. The peripheral circuit 14 may program the data in the selected page.

For a reading operation, the peripheral circuit 14 may receive from the controller 200 a reading command, and a physical block address. Based on the physical block address, a single memory block and a single page therein may be selected. The peripheral circuit 14 may read data from the selected page and output the read data to the controller 200.

For an erasing operation, the peripheral circuit 14 may receive from the controller 200 an erasing command, and a physical block address. Based on the physical block address, a single memory block may be selected. The peripheral circuit 14 may erase data from the selected memory block.

In an embodiment, the semiconductor memory device 100 may be implemented in a nonvolatile memory device. For example, the semiconductor memory device 100 may be implemented in a flash memory device.

Figure 4:
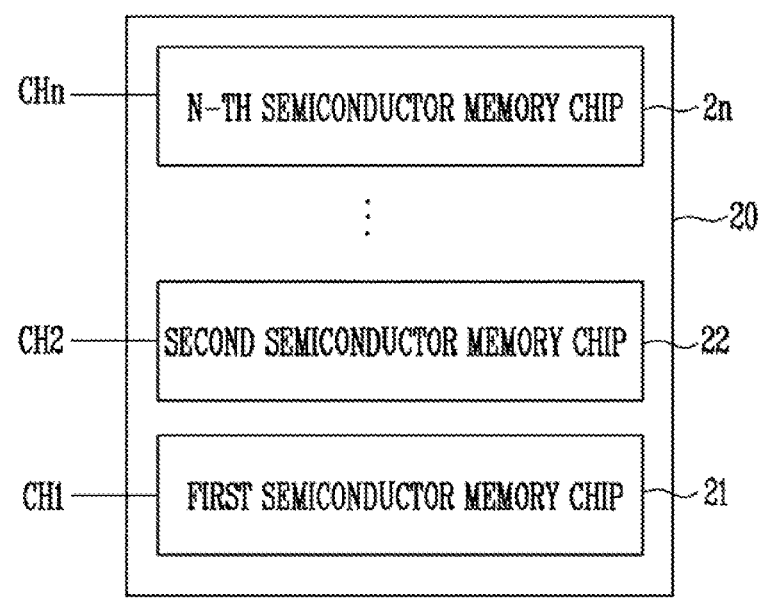
FIG. 4 is a block diagram illustrating a semiconductor memory device, according to another embodiment of the present disclosure.

FIG. 4 is a block diagram illustrating another embodiment 20 of the semiconductor memory device 100 shown in FIG. 1.

Referring to FIG. 4, the semiconductor memory device 20 may include a plurality of semiconductor memory chips 21 to 2n. The plurality of semiconductor memory chips 21 to 2n may be configured to communicate with the controller (200 in FIG. 1) via first to n-th channels CH1 to CHn, respectively. Each semiconductor memory chip may have the same configuration and operation as the semiconductor memory device 10 described above with reference to FIG. 2. The controller 200 may control the first to n-th semiconductor memory chips 21 to 2n via the first to n-th channels CH1 to CHn, respectively.

Each of the first to n-th semiconductor memory chips 21 to 2n may include a plurality of memory blocks, and each of the plurality of memory blocks may include a plurality of pages.

In an embodiment, the first to n-th semiconductor memory chips 21 to 2n may be implemented as the first to n-th memory regions (110_1 to 110_n in FIG. 1). In another embodiment, the memory blocks in each of the semiconductor memory chips 21 to 2n may be implemented as the memory regions (110_1 to 110_n in FIG. 1).

Figure 5:
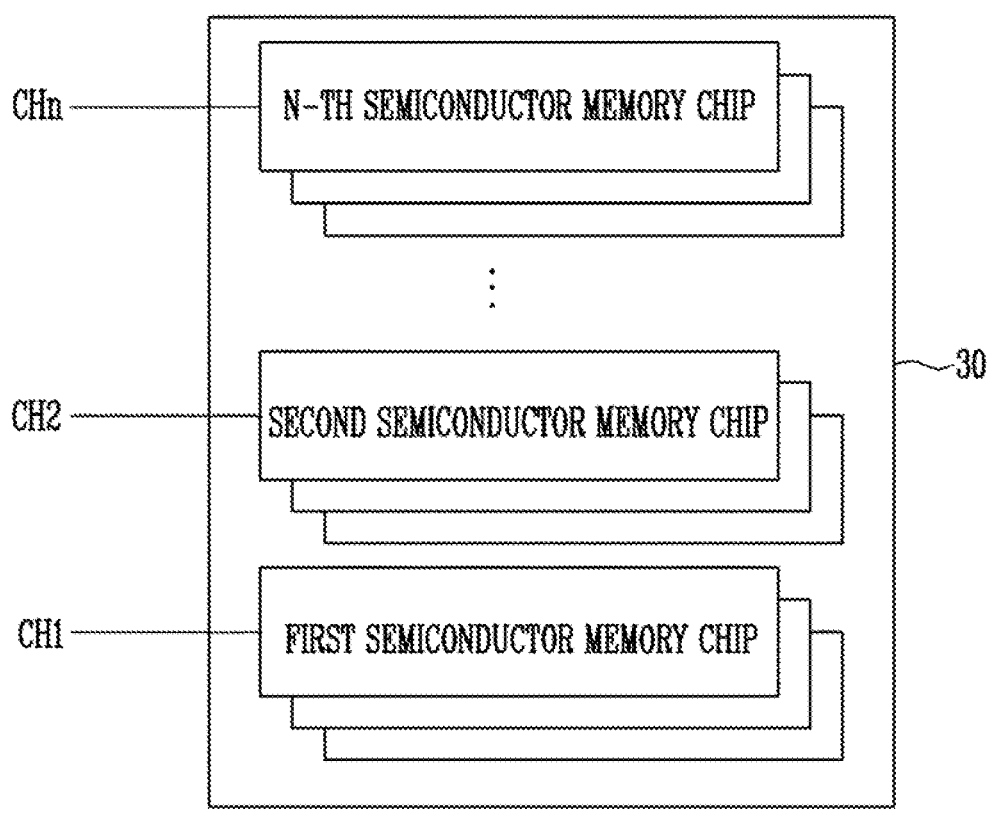
FIG. 5 is a block diagram illustrating a semiconductor memory device, according to yet another embodiment of the present disclosure.

FIG. 5 is a block diagram illustrating yet another embodiment 30 of the semiconductor memory device 100 shown in FIG. 1.

Referring to FIG. 5, the semiconductor memory device 30 may include a plurality of semiconductor memory chips. The plurality of semiconductor memory chips may be grouped into a plurality of groups.

Referring to FIG. 5, the plurality of groups may communicate with the controller 200 via first to n-th channels CH1 to CHn, respectively. Each semiconductor memory chip may have the same configuration and operation as the semiconductor memory device 10 described above with reference to FIG. 2.

The chips in a single group may communicate with the controller 200 via a single channel. The controller 200 may control the plurality of groups via the first to n-th channels CH1 to CHn, respectively.

According to an embodiment of the present disclosure, the plurality of groups may be implemented as the first to n-th memory regions (110_1 to 110_n in FIG. 1). In another embodiment, memory blocks in each of the semiconductor memory chips in each group may be implemented as the memory regions (110_1 to 110_n in FIG. 1).

Hereinafter, for convenience and avoiding unnecessary repetitions, it is described as an example that the memory blocks BLK1 to BLKn in FIG. 2 may be implemented as the first to n-th memory regions (110_1 to 110_n in FIG. 1).

Figure 6:
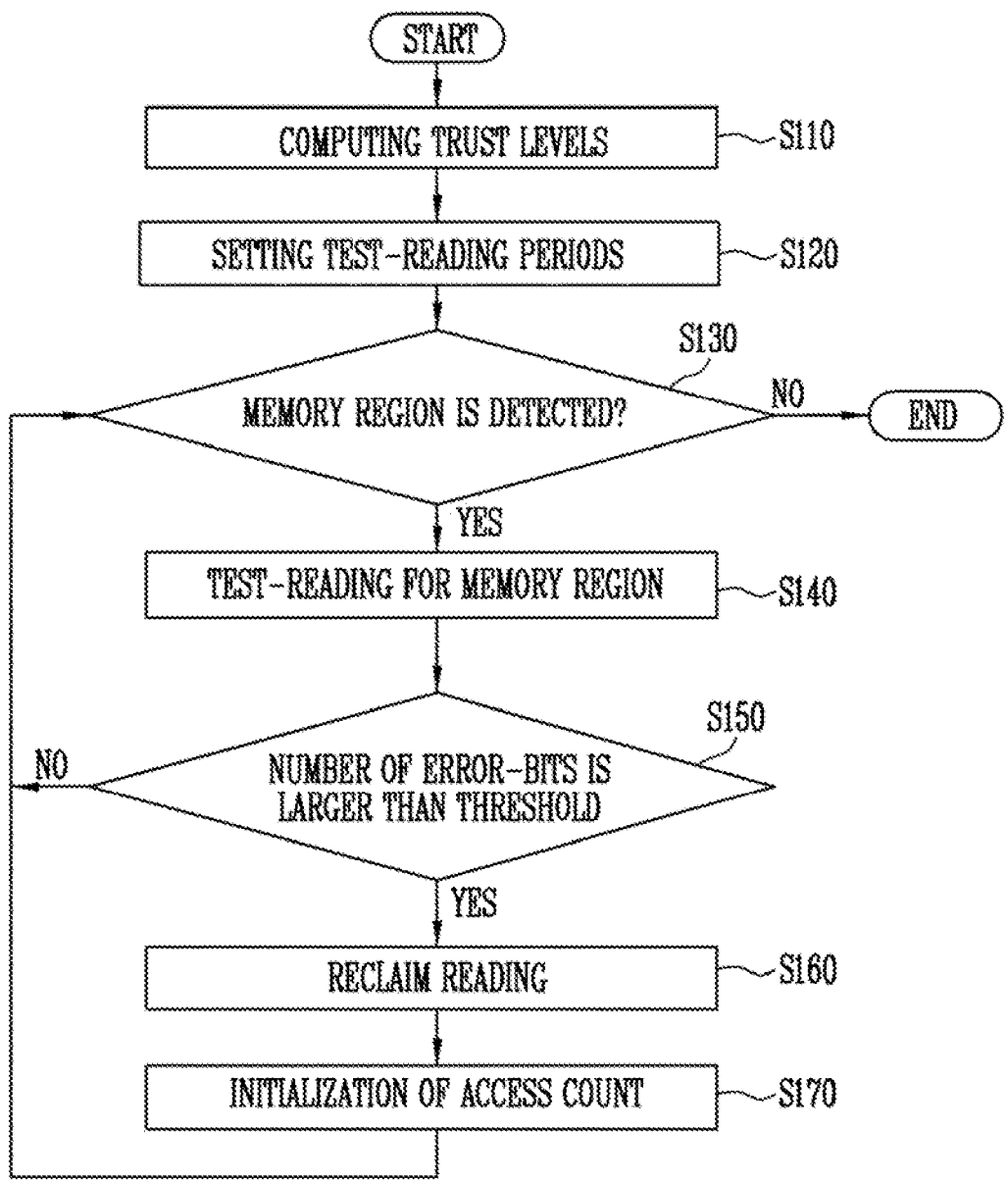
FIG. 6 is a flow chart illustrating an operation method of a memory system, according to an embodiment of the present disclosure.

Referring to FIG. 1 and FIG. 6, an operation method of the memory system 1000 will be described, according to an embodiment of the invention. Specifically, at step S110, error corrections may be respectively carried out for chunks contained in each memory region and, then, trust levels corresponding respectively to the first to n-th memory regions 110_1 to 110_n may be computed.

For example, the memory control module 210 may read data chunks in a first memory region 110_1, and may instruct the error correction code block 220 to correct an error in the read data chunks. The error correction code block 220 may determine error values from the numbers of error bits corresponding to the data chunks. The memory control module 210 may determine a maximum error value from among the error values as a trust level for the first memory region 110_1. In this way, a trust level for the first memory region 110_1 may be computed.

Similarly, the memory control module 210 may compute remaining trust levels corresponding respectively to second to n-th memory regions 110_2 to 110_n.

In an embodiment, for computing the trust levels corresponding respectively to the memory regions 110, the error corrections may be performed for data chunks in a predetermined single page in each memory region. In another embodiment, for computing the trust levels corresponding to the memory regions 110, the error corrections may be performed for data chunks in predetermined plural pages in each memory region.

At step S120, based on the computed trust levels, test-reading periods corresponding to each of the first to n-th memory regions 110_1 to 110_n may be set. In an embodiment, the lengths of test-reading periods may be inverse-proportional with the magnitudes of maximum error values of the memory regions 110. In an embodiment, when a maximum error value of each memory region is larger than a specific reference, a test-reading period for the memory region may have a first value. Meanwhile, when a maximum error value of each memory region is smaller than or equal to the specific reference, a test-reading period for the memory region may have a second value, where the second value is larger than the first value.

Meanwhile, an access count may be monitored for each memory region. The access counter 250 may be configured to count the number of normal-reading times for each memory region, and monitor an access count for the memory region by taking into account the counted number of normal-reading times.

In an embodiment, the number of normal-reading times for at least one pre-determined page in each memory region may be counted. In another embodiment, the number of normal-reading times for all pages in each memory region may be counted.

At S130, it may be determined whether or not a memory region for which the access count reaches a time corresponding to a test-reading period thereof is present. In response to an affirmative result in S130, the method may proceed with S140. For example, let us suppose that from among the memory regions 110, the first memory region 110_1 may have an affirmative result in S130.

Then at S140, at least one test-reading may be performed for the first memory region 110_1. The memory control module 210 may read data from at least one page in the first memory region 110_1, and may instruct the error correction code block 220 to correct an error in the read data.

In an embodiment, a test-reading may be performed for a pre-determined single page in the first memory region 110_1. In another embodiment, test-readings may be respectively performed for pre-determined plural pages in the first memory region 110_1.

At S150, it may be determined where or not the number of error bits contained in the read data is larger than a threshold value. In response to an affirmative result in S150, the method may proceed with S160. In response to a negative result in S150, the method may proceed with S130.

The threshold value may be smaller than the number of error bits correctable by the error correction code block 220. The read data having error bits less than the threshold value may mean that the first memory regions 110_1 has a relatively high data retention level. The read data having error bits more than the threshold value may mean that the first memory regions 110_1 has a relatively low data retention level. In the latter case, the error in the read data may not be corrected.

At S160, a reading operation for the first memory region 110_1 may be reclaimed. The memory control module 210 may read data from the first memory region 110_1, and may program the read data, for example, into a second memory region 110_2. Further, the memory control module 210 may erase the data from the first memory region 110_1.

At S170, the access count for the first memory region 110_1 may be initialized. Thereafter, the method may proceed with S130.

According to an embodiment of the present disclosure, individual test-reading periods may be applied to the memory regions of the semiconductor memory device. This may lead to a decrease in the number of test-reading times and, hence, an enhanced operation rate of the memory system.

Figure 7:
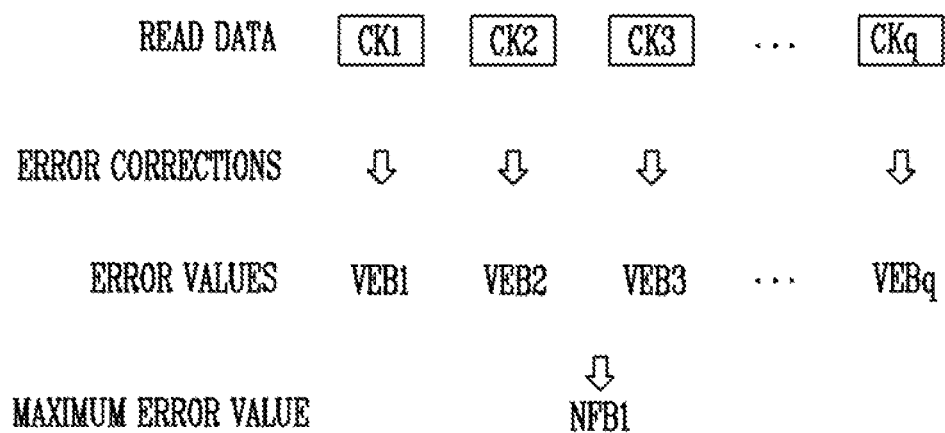
FIG. 7 is a simplified schematic illustrating a method for computing a trust level for a single memory region, according to an embodiment of the present disclosure.

FIG. 7 is a simplified schematic illustrating an example for computing a trust level for a single memory region. Referring to FIG. 1 and FIG. 7, the memory control module 210 may read first to q-th chunks CK1 to CKq contained in each memory region. After this, the error correction code block 220 may perform error corrections for the first to q-th chunks CK1 to CKq. In this way, the numbers of error bits in the first to q-th chunks CK1 to CKq may be computed as first to q-th error values VEB1 to VEBq. The memory control module 210 may determine a maximum error value among the first to q-th error values VEB1 to VEBq as a trust level for the memory region. In the example of FIG. 7, the maximum error value among the first to q-th error values VEB1 to VEBq is the first error value VEB1. In this manner, the trust levels corresponding respectively to the first to n-th memory regions 110_1 to 110_n may be computed.

Figure 8:
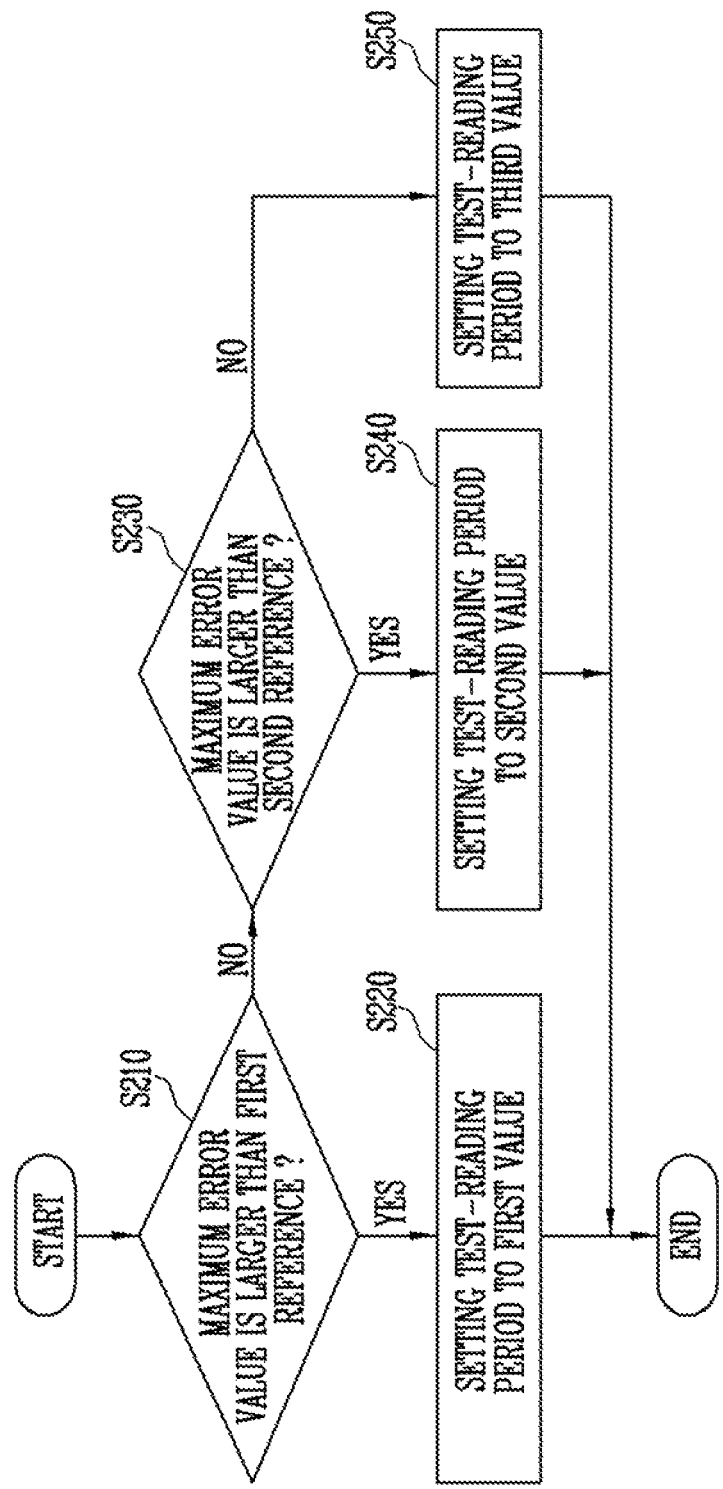
FIG. 8 is a flow chart illustrating a method of determining a test-reading period based on a maximum error value, according to an embodiment of the present disclosure.

Referring to FIG. 8, an example of a method for determining a test-reading period based on a maximum error value is described. Accordingly, at step S210, it may be determined whether a maximum error value is larger than a first reference value. The first reference value may be larger than a second reference value. When the maximum error value is larger than the first reference value, the process may proceed with S220. Otherwise, the process may proceed with S230.

At S220, a test-reading period for a corresponding memory region to the maximum error value may be set to a first value. The maximum error value being larger than the first reference value may mean that the memory region has a low trust level. The first value may be smaller than second and third values.

At S230, it may be determined whether the maximum error value is larger than the second reference value. In response to an affirmative result in step S230, the process may proceed to step S240. In response to a negative result in step S230, the process may proceed to step S250.

At step S240, a test-reading period for the corresponding memory region to the maximum error value may be set to the second value.

At step S250, a test-reading period for the corresponding memory region to the maximum error value may be set to the third value. The maximum error value being smaller than the second reference value may mean that the memory region has a high trust level. The third value may be larger than the first and second values.

FIG. 9 shows an example of a first table TBL1 containing test-reading period values VL1 to VLn. Referring to FIG. 9, the first table TBL1 may contain the values of first to n-th test-reading periods VL1 to VLn corresponding respectively to the first to n-th memory regions 110_1 to 110_n. The first table TBL1 may be stored in the RAM 240 in FIG. 1. The first to n-th test-reading periods VL1 to VLn in the first table TBL1 may be set by the test-reading control module 230 in FIG. 1.

FIG. 10 illustrates an example of a second table TBL2 containing access count values ACCNT1 to ACCNTn. Referring to FIG. 10, the second table TBL2 may contain the values of first to n-th access counts ACCNT1 to ACCNTn corresponding respectively to the first to n-th memory regions 110_1 to 110_n. The access count for each memory region may be increased by one by the access counter 250 in FIG. 1 whenever a normal reading operation is performed for the memory region.

The first table TBL1 and second table TBL2 may be referenced by the test-reading control module 230 in FIG. 1.

FIG. 11 illustrates an example of a representative page among pages PG1 to PGp in each memory region. Referring to FIG. 11, a single page PG1 among first to p-th pages PG1 to PGp may be defined as a representative page. In an embodiment, the representative page may be predetermined. In one example, the representative page may be predetermined by taking into account a manufacturing process, operation characteristics, applications, or the like of the semiconductor memory device 100 in FIG. 1. In another embodiment, the representative page may be determined as a page with a lowest trust level among the first to p-th pages PG1 to PGp. In one example, among the first to p-th pages PG1 to PGp, a page adjacent to drain selection transistors (not shown) in the semiconductor memory device 100 in FIG. 1 may be defined as the representative page. In other example, among the first to p-th pages PG1 to PGp, a page adjacent to source selection transistors (not shown) in the semiconductor memory device 100 in FIG. 1 may be defined as the representative page.

In an embodiment, a trust level for each memory region may be computed with reference to a representative page. Further, a test-reading operation may be performed for the representative page, and it may be determined whether a reading operation for the memory region having the representative page is reclaimed. To be more specific, at S110 in FIG. 6, error corrections may be performed for chunks contained in the representative page of each memory region, and a trust level for each memory region may be computed based on the error corrections. At S140 in FIG. 6, the representative page in the first memory region 110_1 may be test-read, and error corrections may be performed for chunks in the representative page.

In another embodiment, a trust level for each memory region may be computed with reference to all of the pages PG1 to PGp. Further, a test-reading operation may be performed for all of the pages PG1 to PGp, and it may be determined whether to reclaim a reading operation for each memory region, based on the test-reading operation.

FIG. 12 illustrates an example of two or more representative pages among pages PG1 to PGp in each memory region. Referring to FIG. 12, a plurality of pages PG1 to PG3 among the first to p-th pages PG1 to PGp may be defined as representative pages.

In an embodiment, a trust level for each memory region may be computed with reference to the plurality of representative pages. Further, a test-reading operation may be performed for the plurality of representative pages, and it may be determined whether to reclaim a reading operation for the memory region having the representative pages based on the test-reading operation. The more pages are set to be representative pages, the more accurately the characteristics of memory cells in each memory region are reflected into the computation of a trust level for each memory region and the more accurate becomes the setting of a test-reading period thereof. Further, the more pages are set to be representative pages, the more accurate becomes the data retention level determination for each memory region using test-readings.

Figure 13:
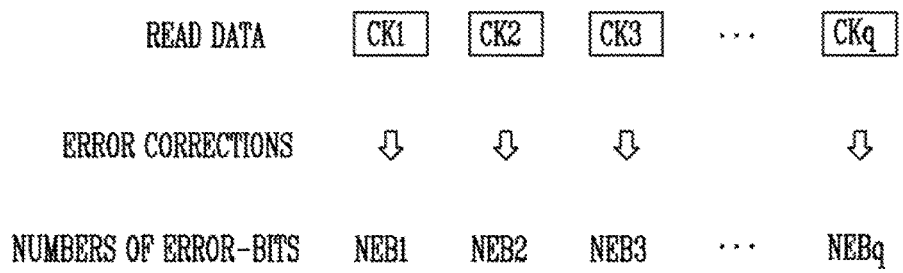
FIG. 13 is a simplified schematic illustrating a method for determining whether to reclaim a reading operation, according to an embodiment of the present disclosure.

FIG. 13 is a simplified schematic illustrating an example of a method for determining whether to reclaim a reading operation. Specifically, referring to FIG. 1 and FIG. 13, when a memory region having an access count reaching a time corresponding to a test-reading period thereof is detected, the memory control module 210 may test-read the first to q-th chunks CK1 to CKq in the detected memory region. The first to q-th chunks CK1 to CKq may be contained in the single representative page as described above with reference to FIG. 11. As an alternative, the first to q-th chunks CK1 to CKq may be contained in the two or more representative pages as described above with reference to FIG. 12. As a further alternative, the first to q-th chunks CK1 to CKq may be contained in all pages in the detected memory region.

Thereafter, the error correction code block 220 may perform error corrections for the first to q-th chunks CK1 to CKq. Thus, the numbers NEB1 to NEBq of error bits corresponding respectively to the first to q-th chunks CK1 to CKq may be computed.

If some of the numbers NEB1 to NEBq of error bits are exceeding a threshold value that may mean that the memory region has some data damaged. In other words, some of the data stored in the memory region may have deteriorated retention characteristics. Hence, when some of the numbers NEB1 to NEBq of error bits for a memory region exceed a threshold value may translate into triggering a reading operation reclaim for that memory region.

Figure 14:
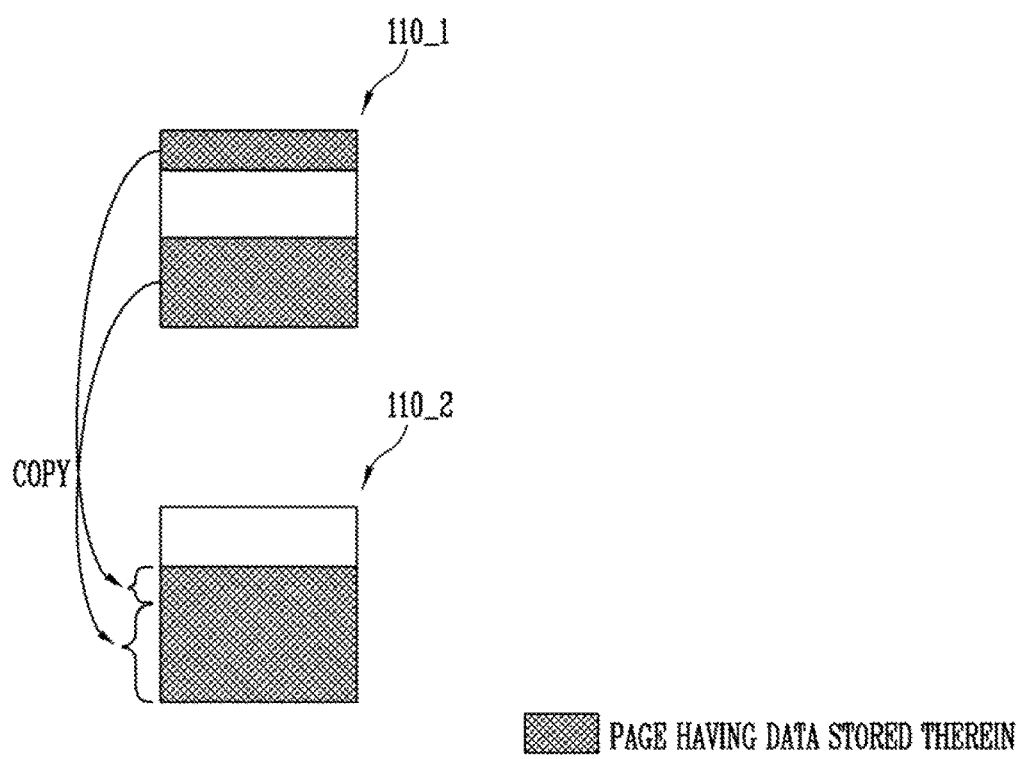
FIG. 14 is a simplified schematic illustrating a method for a reading operation reclaim, according to an embodiment of the present disclosure.

FIG. 14 illustrates an embodiment of a reading operation reclaim. In FIG. 14, we suppose, as an example that a reading operation for the first memory region 110_1 is reclaimed. Hence, referring to FIG. 1 and FIG. 14, data stored in the first memory region 110_1 may be copied to another memory region. For example, said another memory region may be a second memory region 110_2. The memory control module 210 may read data from the first memory region 110_1, for example, the memory control module 210 may read data from pages in the first memory region 110_1. Next, the memory control module 210 may program the read data into the second memory region 110_2. In an embodiment, the memory control module 210 may program the read data into sequentially-increasing page addresses in the second memory region 110_2.

Figure 15:
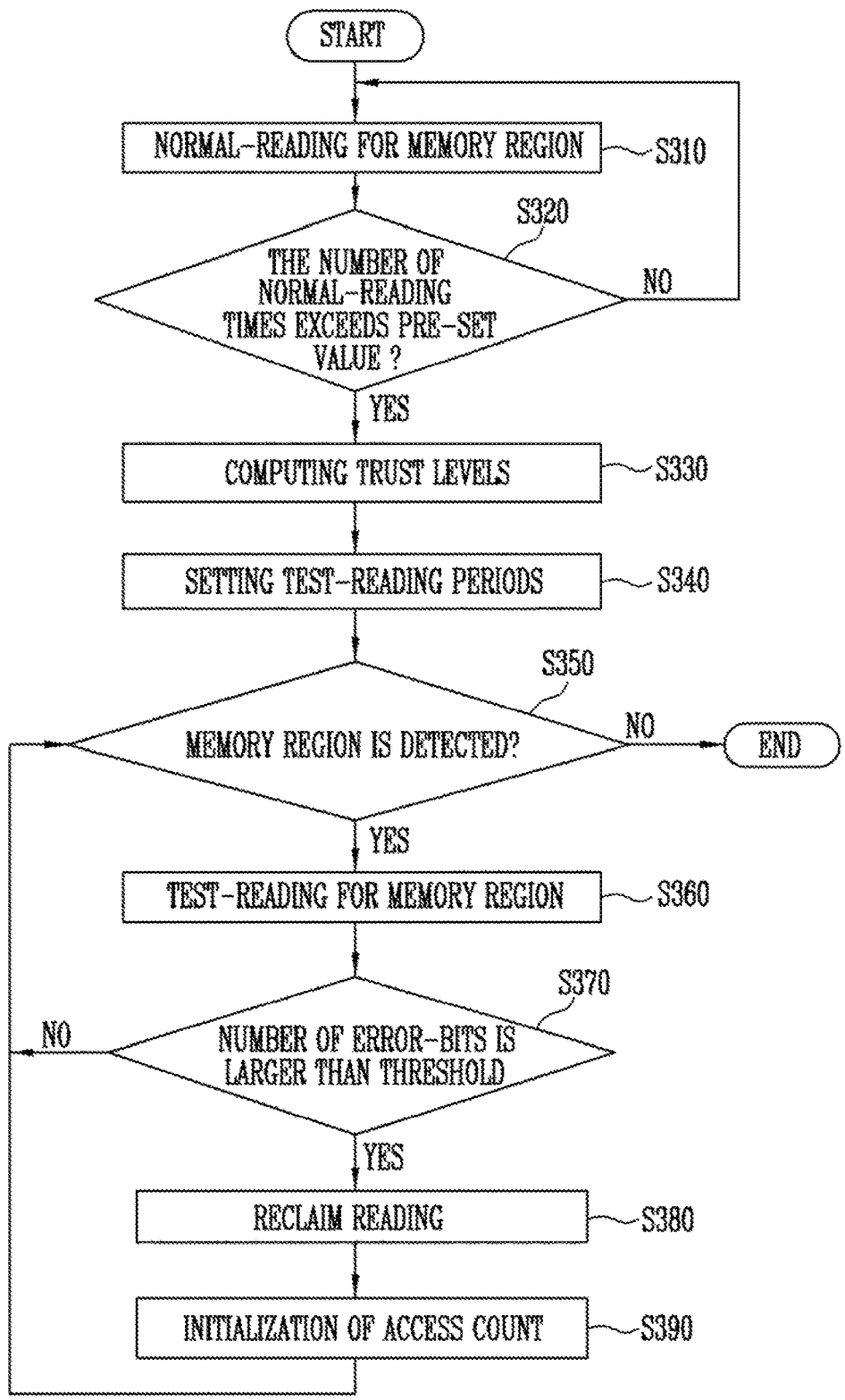
FIG. 15 is a flow chart illustrating a method of operating a memory system, according to another embodiment of the present disclosure.

FIG. 15 is a flow chart illustrating a method of operating a memory system 1000, according to another embodiment of the present disclosure. Referring to FIG. 1 and FIG. 15, at step S310, in response to a reading request, a memory region is subjected to a normal reading operation. To be specific, the memory control module 210 may perform the normal reading operation for a selected memory region in response to a receipt of the reading request from an external host. At S320, it may be determined whether the number of normal-reading times for each memory region is larger than a predetermined value. In response to a negative result in S320, the method may proceed with S310. In response to an affirmative result in S320, the method may proceed with S330.

In other words, at S310 and S320, it may be determined whether a memory region for which a normal reading operation is performed more than the predetermined number of times is present. The number of times may be pre-determined by taking into account a manufacturing process, operation characteristics, applications, or the like of the semiconductor memory device 100 in FIG. 1.

According to an embodiment of the present disclosure, when it is determined that a normal reading operation is performed for a memory region more than the predetermined number of times, a step S330 operation may be carried out for the memory region. In this way, a series of operations S330 and S340 for setting a test-reading period may occur at different temporal points between the memory regions. This approach may have less load imposed on the memory system 1000, compared to an approach where a series of operations for setting a test-reading period occurs at the same time between the memory regions.

At S330, for the memory region having a normal reading operation performed more than the predetermined number of times, a trust level may be computed. At S340, a test-reading period may be set for the memory region.

Subsequently, S350 to S390 may be carried out in the same manner as steps S130 to S170 in FIG. 6. Thus, details about S350 to S390 are not repeated.

Figure 16:
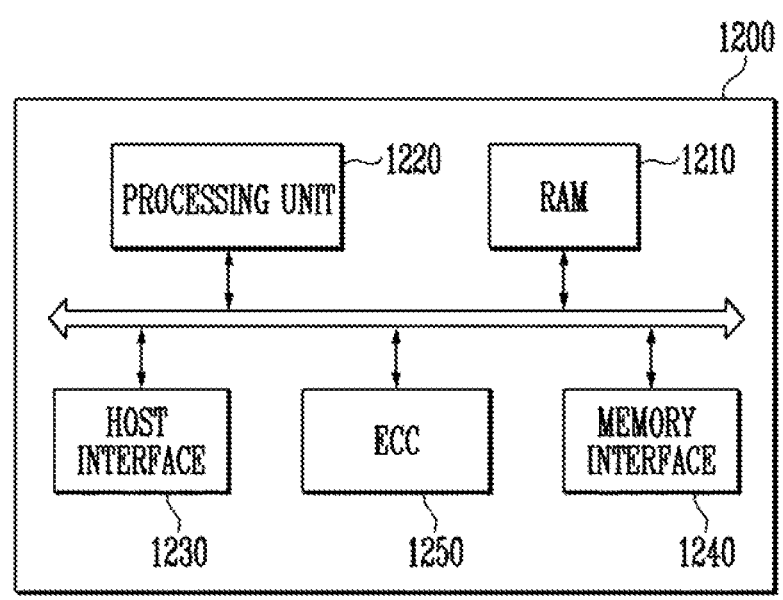
FIG. 16 is a block diagram illustrating a controller suitable for a memory system, according to an embodiment of the present disclosure.

FIG. 16 is a block diagram illustrating an embodiment 1200 of a controller 200 as shown in FIG. 1. Referring to FIG. 16, the controller 1200 may include a RAM 1210, a processing unit 1220, a host interface 1230, a memory interface 1240, and an error correction code block 1250.

The processing unit 1220 may control all operations of the controller 1200. The RAM 1210 may serve as one or more of a work memory of the processing unit 1220, a cache memory between the semiconductor memory device 100 in FIG. 1 and the host, and a buffer memory between the semiconductor memory device 100 and the host. The processing unit 1220 and RAM 1210 may perform functions of the memory control module 220, the test-reading control module 230 and the access counter 250 in FIG. 1. For example, the processing unit 1220 may perform functions of the memory control module 220, test-reading control module 230 and access counter 250 by loading a program command, data file, data structure, etc. into the RAM 1210, and executing the loaded data.

Additionally, the RAM 1210 may serve as the RAM 240 in FIG. 1. Although, in FIG. 16, a single RAM 1210 is provided, two or more RAMs may be provided.

The host interface 1230 may include a protocol used to exchange data between the host and controller 1200. In one embodiment, the controller 1200 may communicate with the host via various interface protocols. The protocol may include, but not limited to, universal serial bus (USB) protocol, multimedia card (MMC) protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, and integrated drive electronics (IDE) protocol, private protocol or the like.

The memory interface 1240 may interface with the semiconductor memory device 100. For example, the memory interface may include a NAND or NOR interface. The error correction code block 1250 may be configured to act as the error correction code block 220 in FIG. 1.

The controller 1200 and the semiconductor memory device 100 may be integrated into a single semiconductor device. In an embodiment, the controller 1200 and the semiconductor memory device 100 may be integrated into a single semiconductor device to form a memory card such as a PC card (PCMCIA, personal computer memory card international association), compact flash card (CF), smart media card (SM, SMC), memory stick, multimedia card (MMC, RS-MMC, MMCmicro), SD card (SD, miniSD, microSD, SDHC), universal flash storage (UFS), or the like.

In an embodiment the controller 1200 and the semiconductor memory device 100 may be integrated into a single semiconductor drive (SSD, Solid State Drive). The semiconductor drive (SSD) may refer to a storage device configured to store data in the semiconductor memory. When the memory system (1000 in FIG. 1) including the controller 1200 and the semiconductor memory device 100 is implemented as the semiconductor drive (SSD), this may lead to a considerable enhancement in an operation rate of the host system coupled to the memory system 1000.

In an embodiment, the memory system (1000 in FIG. 1) including the controller 1200 and the semiconductor memory device 10 may be provided as a single component of an electronic device. Examples, of suitable electronic devices may include, but not limited to, a computer, UMPC (ultra mobile PC), a workstation, a net-book, a PDA (personal digital assistants), a portable computer, a web tablet, a wireless phone, a mobile phone, a smart phone, an e-book, a PMP (portable multimedia player), a portable game player, a navigation device, a black box, a digital camera, a 3-dimensional television, a digital audio recorder, a digital audio player, a digital picture recorder, a digital picture player, a digital video recorder, a digital video player, a device with a wireless data communication, one or more components of a home networking, a computer networking, a telematics networking, a computing system, and a RIFD device, or the like.

The memory system (1000 in FIG. 1) including the controller 1200 and the semiconductor memory device 100 may be packaged in various forms. For example, such packages may include, but not limited to package on package (PoP), ball grid arrays (BGA), chip scale packages (CSP), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), wafer-level processed stack package (WSP) or the like.

According to an embodiment of the present disclosure, the individual test-reading periods may be applied to the memory regions of the semiconductor memory device. In this way, the number of times of test-readings may be reduced and the operation rate of the memory system may be improved.

The above description is not to be taken in a limiting sense, but is made merely for the purpose of describing the general principles of various embodiments of the invention. Many additional embodiments of this invention are possible. It is understood that no limitation of the scope of the invention is thereby intended. The scope of the disclosure should be determined with reference to the appended Claims. Reference throughout this specification to "an embodiment," "an embodiment," or similar language means that a particular feature, structure, or characteristic that is described in connection with the embodiment is included in at least an embodiment of the present disclosure. Thus, appearances of the phrases "in an embodiment," "in an embodiment," and similar language throughout this specification may, but do not necessarily, all refer to the same embodiment. It should be understood that any feature described in relation to an embodiment may also be used, to the extent that may be compatible, with any other embodiment of the invention.

What is claimed is:

1. A method of operating a memory system including memory regions, the method comprising:
    calculating trust levels for memory regions, respectively by performing error corrections for chunks in each of the memory regions;
    setting test-reading periods corresponding respectively to the memory regions, based on the trust levels for the memory regions;
    storing access counts for at least one representative page among a plurality of pages included in each of the memory regions based on a number of normal-reading times for each of the memory regions;
    performing, if an access count for a first memory region among the memory regions reaches a test-reading period for the first memory region, one or more test-readings for the first memory region; and
    performing a read reclaim operation to move data stored in the first memory region to another region based on a result of the one or more test-readings,
    wherein the calculating trust levels comprises:
    obtaining error values corresponding respectively to the chunks in each memory region by performing the error corrections for the chunks; and
    determining a maximum error value among the error values as a trust level for the memory region, and
    wherein the one or more test-readings determine whether each data chunk among data chunks stored in the first memory region contains a number of error bits greater than or equal to a threshold value.

2. The method of claim 1, wherein the performing the read reclaim operation comprises:
    acquiring the data chunks from the first memory region; and
    storing the data chunks in a second memory region among the memory regions.

3. The method of claim 1, wherein when the maximum error value for the memory region is larger than a reference value, a test-reading period for the memory region has a first value,
    wherein when the maximum error value for the memory region is smaller than or equal to the reference value, the test-reading period for the memory region has a second value larger than the first value.

4. The method of claim 1, wherein a test reading period for the memory region is inverse-proportional to a magnitude of the maximum error value for the memory region.

5. The method of claim 1, wherein normal-readings for each memory region are performed on the plurality of pages therein.

6. The method of claim 1, wherein the one or more test-readings for the first memory region are performed on the at least one representative page therein.

7. A method of operating a memory system including memory regions, the method comprising:
    performing first normal-readings for a selected memory region among the memory regions, in response to first requests from an external;
    calculating a trust level corresponding to the selected memory region when a number of times of the first normal-readings is larger than a pre-determined value by performing error corrections for chunks in the selected memory region;
    setting a test-reading period corresponding to the selected memory region, based on the trust level for the selected memory region;
    performing second normal-readings for the selected memory region in response to second requests from the external;
    storing an access count for at least one representative page among a plurality of pages included in the selected memory region based on a number of times of the second normal-readings for the selected memory region; and
    performing, if the access count for the selected memory region reaches the test-reading period for the selected memory region, one or more test-readings for the selected memory region; and
    performing a read reclaim operation to move data stored in the selected memory region to another region based on a result of the one or more test-readings,
    wherein the calculating the trust level comprises:
    obtaining error values corresponding respectively to the chunks in the selected memory region by performing the error corrections for the chunks; and
    determining a maximum error value among the error values as the trust level for the selected memory region, and
    wherein the one or more test-readings determine whether each data chunk among data chunks stored in the selected memory region contains a number of error bits greater than or equal to a threshold value.

8. The method of claim 7, wherein when the maximum error value for the selected memory region is larger than a reference value, the test-reading period for the selected memory region has a first value, wherein when the maximum error value for the selected memory region is smaller than or equal to the reference value, the test-reading period for the selected memory region has a second value larger than the first value.

9. The method of claim 7, wherein each of the memory regions includes a plurality of pages,
wherein the chunks subjected to the error corrections in the performing error corrections for chunks and computing a trust level are contained in the at least one representative page among the plurality of pages in the selected memory region.

10. The method of claim 7, wherein the one or more test-readings for the selected memory region are performed on the at least one representative page therein,
wherein the first normal-readings and the second normal-readings for the selected memory region are performed on the at least one representative page therein.

11. A memory system comprising:
a semiconductor memory device including memory regions, each memory region including a plurality of memory cells; and
a controller configured to access the semiconductor memory device,
wherein the controller comprises:
a memory control module configured to calculate trust levels corresponding respectively to the memory regions based on error corrections for chunks in each of the memory regions;
a test-reading control module configured to set test-reading periods corresponding respectively to the memory regions, based on the trust levels for the memory regions;
a random access memory (RAM) configured to store the test-reading periods; and
an access counter configured to store a number of normal-reading times for at least one representative page among a plurality of pages included in each of the memory regions as access counts corresponding respectively to the memory regions,
wherein a test reading control module detects a memory region of which a access count reaches a test-reading period thereof, among the memory regions,
wherein the memory control module performs one or more test-readings for the detected memory region, and determines, based on a result of the test-readings, whether to reclaim a reading for the detected memory region, and
wherein the memory control module is further configured to obtain error values corresponding respectively to the chunks in each memory region by performing the error corrections for the chunks and to determine a maximum error value among the error values as a trust level for the memory region during the one or more test-readings.

* * * * *